United States Patent [19]
Singh

[11] Patent Number: 5,969,378
[45] Date of Patent: Oct. 19, 1999

[54] LATCH-UP FREE POWER UMOS-BIPOLAR TRANSISTOR

[75] Inventor: Ranbir Singh, Cary, N.C.

[73] Assignee: Cree Research, Inc., Durham, N.C.

[21] Appl. No.: 08/891,221

[22] Filed: Jul. 10, 1997

Related U.S. Application Data

[60] Provisional application No. 60/049,423, Jun. 12, 1997.

[51] Int. Cl.$^6$ .............................................. H01L 31/0312
[52] U.S. Cl. ......................... 257/77; 257/330; 257/378; 257/133
[58] Field of Search .................................... 257/330, 331, 257/77, 378, 329, 133

[56] References Cited

U.S. PATENT DOCUMENTS

| | | | |
|---|---|---|---|
| 4,048,649 | 9/1977 | Bohn | 257/330 |
| 4,329,705 | 5/1982 | Baker | 257/330 |
| 4,725,562 | 2/1988 | El-Kareh et al. | 257/514 |
| 4,799,095 | 1/1989 | Baliga | 357/38 |
| 4,945,394 | 7/1990 | Palmour et al. | 357/34 |
| 4,981,551 | 1/1991 | Palmour | 156/643 |
| 5,014,102 | 5/1991 | Adler | 257/38 |
| 5,087,576 | 2/1992 | Edmond et al. | 437/22 |
| 5,168,331 | 12/1992 | Yilmaz | 257/331 |
| 5,170,231 | 12/1992 | Fujii et al. | 357/23.2 |
| 5,202,750 | 4/1993 | Gough | 257/133 |
| 5,233,215 | 8/1993 | Baliga | 257/490 |
| 5,264,713 | 11/1993 | Palmour | 257/77 |
| 5,270,554 | 12/1993 | Palmour | 257/77 |
| 5,304,821 | 4/1994 | Hagino | 257/133 |
| 5,323,040 | 6/1994 | Baliga | 257/332 |
| 5,331,194 | 7/1994 | Ueno | 257/498 |
| 5,396,085 | 3/1995 | Baliga | 257/77 |
| 5,459,107 | 10/1995 | Palmour | 437/238 |
| 5,488,236 | 1/1996 | Baliga et al. | 257/132 |
| 5,489,787 | 2/1996 | Amaratunga et al. | 257/137 |
| 5,506,421 | 4/1996 | Palmour | 257/77 |
| 5,539,217 | 7/1996 | Edmond et al. | 257/77 |
| 5,679,966 | 10/1997 | Baliga et al. | 257/77 |
| 5,719,409 | 2/1998 | Singh et al. | 257/330 |
| 5,723,891 | 3/1998 | Malhi | 257/341 |

FOREIGN PATENT DOCUMENTS

| | | |
|---|---|---|
| 0 159 663 A3 | 4/1985 | European Pat. Off. . |
| 2524711 | 10/1983 | France . |
| 61-104667 | 9/1986 | Japan . |
| 63-047983 | 2/1988 | Japan . |
| 4-029368 | 1/1992 | Japan . |
| 5-082792 | 4/1993 | Japan ..................................... 257/330 |
| WO 89/04056 | 5/1989 | WIPO . |

OTHER PUBLICATIONS

Narayanan, E. M. Sankara, et al., CMOS compatible 250 V Lateral Insulated Base Transistors, $3^{rd}$ International Symposium on Power Semiconductor Devices and ICs, pp. 181–186 (1991).

Parpia, Zahir, et al., A Novel CMOS–Compatible High-Voltage Transistor Structure, *I.E.E.E. Transactions on Electron Devices*, pp. 1948–1952 (1986).

O, Kenneth, et al., PMOS Input Merged Bipolar–Sidewall MOS Transistors (PBiMOS Transistors), *IEEE Electron Device Letters*, vol. 12, No. 2, pp. 68–70 (New York, 1991).

PCT International Search Report, PCT/US98/12007, Sep. 30, 1998.

*Primary Examiner*—David B. Hardy
*Attorney, Agent, or Firm*—Myers Bigel Sibley & Sajovec; Philip Summa

[57] ABSTRACT

A MOS bipolar transistor is provided which includes a silicon carbide npn bipolar transistor formed on a bulk single crystal n-type silicon carbide substrate and having an n-type drift layer and p-type base layer. A silicon carbide nMOS-FET is formed adjacent the npn bipolar transistor such that a voltage applied to the gate of the nMOSFET causes the npn bipolar transistor to enter a conductive state. The nMOSFET has a source and a drain formed so as to provide base current to the npn bipolar transistor when the bipolar transistor is in a conductive state. Also provide are means for converting electrons flowing between the source and the drain into holes for injection into the p-type base layer. Unit cells and methods of forming such devices are also provided.

30 Claims, 10 Drawing Sheets

LATCH-UP FREE POWER UMOS-BIPOLAR TRANSISTOR

RELATED APPLICATIONS

The present application is related to and claims priority from U.S. Provisional Patent Application Ser. No. 60/049,423, filed Jun. 12, 1997 and entitled LATCHUP-FREE POWER UMOS-BIPOLAR TRANSISTOR (LMBT).

FIELD OF THE INVENTION

The present invention relates to semiconductor devices and more particularly to such devices formed in silicon carbide. The present invention particularly relates to power transistors formed in silicon carbide.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 200 to 50 A/cm$^2$ and support relatively high blocking voltages in the range of 500–2500 V.

Despite the attractive power ratings achieved by bipolar transistors, there exist several fundamental drawbacks to their suitability for all high power applications. Bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turnon and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary. This current diversion generally results from the decrease in on-state voltage drop across the bipolar device with increases in operating temperature.

The silicon power MOSFET was developed to address this base drive problem. In a power MOSFET, the gate electrode provides turn-on and turn-off control upon the application of an appropriate gate bias. For example, turn-on in an n-type enhancement MOSFET occurs when a conductive n-type inversion layer is formed in the p-type channel region in response to the application of a positive gate bias. The inversion layer electrically connects the n-type source and drain regions and allows for majority carrier conduction therebetween.

The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented.

Moreover, because current conduction in the MOSFET occurs through majority carrier transport only, the delay associated with the recombination of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also easily be paralleled, because the forward voltage drop of power MOSFETs increases with increasing temperature, thereby promoting an even current distribution in parallel connected devices.

The above-described beneficial characteristics of power MOSFETs are typically offset, however, by the relatively high on-resistance of the MOSFET's drift region for high voltage devices, which arises from the absence of minority carrier injection. As a result, a MOSFET's operating forward current density is typically limited to relatively low values, typically in the range of 40–50 A/cm$^2$, for a 600 V device, as compared to 100–120 A/cm$^2$ for the bipolar transistor.

On the basis of these features of power bipolar transistors and MOSFET devices, devices embodying a combination of bipolar current conduction with MOS-controlled current flow were developed and found to provide significant advantages over single technologies such as bipolar or MOSFET alone. One example of a device which combines bipolar and MOS characteristics is the Insulated Gate Bipolar Transistor (IGBT).

The IGBT combines the high impedance gate of the power MOSFET with the small on-state conduction losses of the power bipolar transistor. Because of these features, the IGBT has been used extensively in inductive switching circuits, such as those required for motor control applications. These applications require devices having wide forward-biased safe-operating-area (FBSOA) and wide reverse-biased safe-operating-area (RBSOA).

One disadvantage of an IGBT is its limited gate control on-state current density. This arises from the presence of a parasitic thyristor in its structure. At sufficiently high on-state current densities, this thyristor latches up, thereby losing gate control over the on current. This characteristic of IGBT's also limits the IGBT's surge current capability. Many proposals have been made for mechanisms to suppress the effectiveness of this parasitic thyristor at the cost of on-state voltage drop and switching speed.

Recent efforts have also included investigation of the use of silicon carbide (SiC) devices for power devices. Such devices include power MOSFETs such as are described in U.S. Pat. Ser. No. 5,506,421. Similarly, silicon carbide Junction Field Effect Transistors (JFETs) and Metal-Semiconductor Field Effect Transistors (MESFETs) have also been proposed for high power applications. See U.S. Pat. Nos. 5,264,713 and 5,270,554. These devices, however, have a forward voltage drop of approximately 3 volts as a minimum voltage drop. Thus, these devices are not suitable for all applications.

Figure 1:
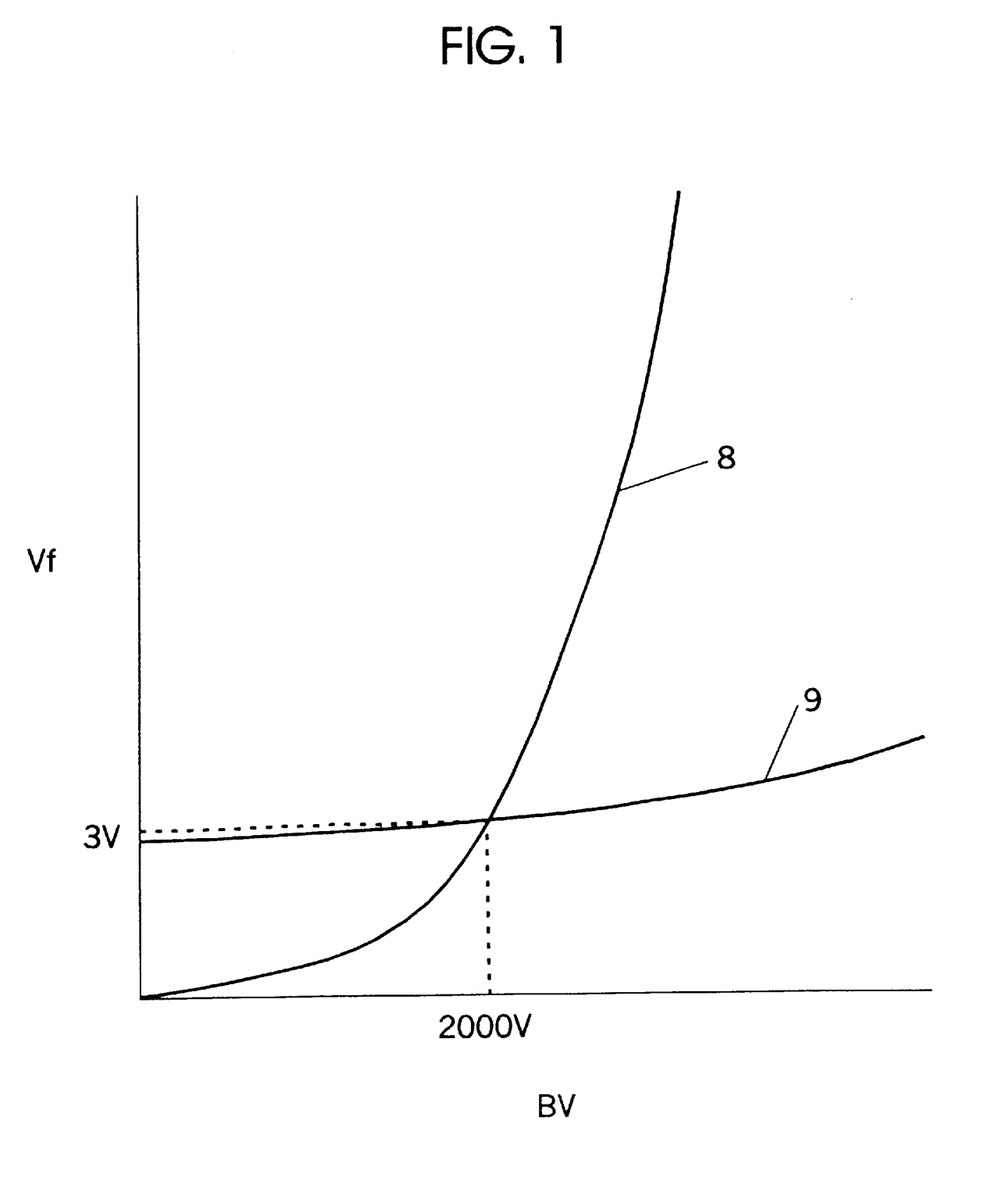
FIG. 1 is a graph of breakdown voltage versus forward voltage drop for silicon MOSFETs and JFETs and silicon carbide IGBTs.

Silicon carbide IGBTs may further provide improved performance over other power devices because the forward voltage drop of the device does not increase with breakdown voltage at the same rate for an IGBT as for a MOSFET or JFET. As is illustrated in FIG. 1, the curve of breakdown voltage (BV) versus forward voltage drop (Vf) for a MOSFET/JFET 8 crosses the curve for a silicon carbide IGBT 9 at about 2000 V. Thus, for breakdown voltages of greater than 2000 V silicon carbide IGBTs may provide better performance in terms of forward voltage drop for the same breakdown voltage than silicon MOSFETs or JFETs.

While the characteristics of the silicon carbide IGBT indicate promise as a power device, such devices are currently limited in their applicability in silicon carbide. These limitations are a result of the present difficulties in fabricating high quality p-type silicon carbide substrates as well as the very low hole mobility in silicon carbide, thereby making it very susceptible to parasitic thyristor latch-up. Therefore, silicon carbide IGBTs are expected to have a low value of gate controlled on-state current density. Because the IGBT is typically a vertical device, the substrate on which the device is fabricated may be critical to device performance. The quality of the substrate material may be a limiting factor in the fabrication of quality devices. Thus, the difficulty in manufacturing high quality p-type silicon carbide substrates may presently limit the fabrication of IGBTs to n-type substrates.

In conventional power circuits it is desirable to have a device which may be referenced to ground in that the control voltage applied to the device to turn the device on and off is referenced to ground rather than to a high positive voltage level. However, to provide an IGBT where the gate is referenced to the emitter of the device generally requires a p-type substrate. As is noted above, p-type substrates currently are more difficult to fabricate than n-type substrates in silicon carbide. With an n-type substrate a silicon carbide IGBT would have its gate voltage referenced to the collector voltage which, in a typical power circuit would be to a line voltage. Thus, present silicon carbide IGBTs may require more complex gate drive circuitry and result in more complex power circuits as a result of the structure of IGBTs, the electrical characteristics of silicon carbide and the limitations in fabrication of highly doped p-type silicon carbide substrates.

In light of the above discussion, there exists a need for improvements in high power silicon carbide devices.

OBJECT AND SUMMARY OF THE INVENTION

In view of the foregoing, it is one object of the present invention to provide a silicon carbide power device.

A further object of the present invention is to provide a silicon carbide power device which is voltage controlled.

Yet another object of the present invention is to provide a silicon carbide power device which may have its control voltage referenced to ground in typical power circuits while the collector voltage is capable of blocking a positive high voltage.

Still another object of the present invention is to provide a silicon carbide power device which may be fabricated on an n-type silicon carbide substrate.

Another object of the present invention is to provide a bipolar transistor which may be paralleled with other bipolar transistors with reduced instability arising from the decreasing on-state voltage drop of bipolar transistors with an increase in operating temperature.

These and other objects of the present invention are provided by a MOS bipolar transistor which includes a silicon carbide npn bipolar transistor formed on a bulk single crystal n-type silicon carbide substrate and having an n-type drift layer and p-type base layer. A silicon carbide nMOS-FET is formed adjacent the npn bipolar transistor such that a voltage applied to the gate of the nMOSFET causes the npn bipolar transistor to enter a conductive state. The nMOSFET has a source and a drain formed so as to provide base current to the npn bipolar transistor when the bipolar transistor is in a conductive state. Also included is means for converting electron current flowing between the source and the drain into hole current for injection into the p-type base layer.

In particular embodiments, the means for converting comprises a silicon carbide tunnel diode formed between the nMOSFET and the npn bipolar transistor so as to convert electron current flowing through the nMOSFET into hole current for injection into the base layer of the npn bipolar transistor. In such an embodiment the silicon carbide nMOSFET has an n-type conductivity source region and the tunnel diode is formed by forming a region of p-type conductivity silicon carbide having a higher carrier concentration than the p-type base layer adjacent the n-type conductivity source region so as to form a conductive p-n tunnel junction between the source region and the p-type conductivity region.

In another embodiment, the means for converting includes a region of p-type conductivity silicon carbide formed in the p-type base layer and having a higher carrier concentration than the p-type base layer and forming an electrically conductive strap for electrically connecting the n-type source region of the nMOSFET to the region of p-type conductivity silicon carbide.

In particular embodiments of the present invention, the silicon carbide nMOSFET comprises a UMOSFET having a gate trench formed adjacent the npn bipolar transistor and having a source region formed so as to provide electrons to the means for converting and wherein the npn bipolar transistor comprises a vertical npn bipolar transistor. Furthermore, the MOS bipolar transistor may be formed of a plurality of unit cells so as to provide a plurality of electrically parallel npn bipolar transistors.

By forming a MOS gated bipolar transistor where the electron current flow in the MOS transistor is converted to hole current flow for injection into the bipolar transistor as base current, a voltage controlled bipolar device is provided. Furthermore, because the bipolar device is an npn device the bipolar transistor may be formed on an n-type silicon carbide substrate. Thus, the disadvantages of using a p-type substrate may be overcome. Also, because the device is an npn bipolar device the emitter of the device may be grounded which allows the gate control to be referenced to ground. Thus, in power circuits, devices of the present invention may utilize a ground referenced control circuit.

Furthermore, because base current of the bipolar device is injected from a MOS inversion channel which uses n channel conduction, the impact of low electron mobility of silicon carbide may be reduced. Also, the characteristics of the MOS transistor which supplies base current to the bipolar device may tend to stabilize operation of multiple paralleled bipolar devices. Thus, while on-state resistance of the bipolar device decreases with increased temperature, on-state resistance of the base drive MOS transistor increases with temperature. The increased resistance of the MOS base drive transistor results in reduced base current in the bipolar device which then results in reduced current flow through the bipolar transistor. Therefore, even if the on-state resistance of the bipolar transistor reduces with temperature the current through the transistor may be reduced because of the reduced base current supplied by the MOS transistor. This interaction may provide added benefit where devices according to the present invention are comprised of a unit cell which may be replicated to provide for multiple electrically parallel bipolar transistors in a single substrate to allow increased current capability.

Devices according to the present invention also have no possibility of latch-up. The present devices are latch-up free because no parasitic thryistor exists in the structure of the present invention in contrast to the structure of an IGBT.

Devices according to the present invention also provides a wide forward bias safe operating area because of the presence of current saturation mode. Also devices according to the present invention have a large reverse bias safe operating area because of the higher impact ionization rate of holes than electrons. These characteristics are especially suitable for inductive switching applications.

In addition to embodiments described above, the present invention also provides a unit cell of a UMOS bipolar transistor which includes an n-type bulk single crystal silicon carbide substrate and an n-type silicon carbide drift layer formed on the n-type conductivity bulk single crystal silicon carbide substrate. The n-type drift layer has a carrier concentration of less than the n-type silicon carbide substrate. A p-type silicon carbide base layer is formed on the n-type silicon carbide drift layer and a first region of n-type silicon carbide is formed in the p-type base layer. A gate trench is formed in the p-type base layer and extends through the base layer and a portion of the first region of n-type silicon carbide to the drift layer to provide a portion of the first n-type region as a portion of the sidewall of the gate trench. An insulating layer is formed on the bottom and sidewalls of the gate trench and a second region of n-type conductivity silicon carbide is formed in the base layer adjacent and disposed from the gate trench. A conductive gate contact is formed on the insulating layer and extending over a portion of the first n-type region. A collector contact is formed on a surface of the silicon carbide substrate opposite the drift layer. A p-type region of silicon carbide is formed in the base layer and is disposed between the first n-type region and the second n-type region. The p-type region has a carrier concentration greater than the carrier concentration of the p-type base layer and is formed so as to provide a reservoir of holes that convert electron current flowing through the first n-type region into hole current for injection into said p-type base layer. Finally, an emitter contact is formed on the second n-type region of silicon carbide.

In particular embodiments, a second p-type region of silicon carbide formed in the n-type silicon carbide drift region at the bottom of the gate trench is also provided. This second p-type region preferably has a carrier concentration greater than the carrier concentration of the n-type drift layer.

In another embodiment, the first p-type region forms a p-n junction with the first n-type region so as to provide a tunnel diode. Alternatively, a conductive strap formed between the first n-type region and the p-type region may be provided to electrically connect the p-type region to the first n-type region.

In particular embodiments of the present invention, the p-type base layer has a thickness of from about 0.3 $\mu$m to about 5 $\mu$m. The n-type drift region may have a thickness of from about 3 $\mu$m to about 500 $\mu$m. The n-type drift region may also have a carrier concentration of from about $1\times10^{12} cm^{-3}$ to about $1\times10^{17} cm^{-3}$ and the p-type base layer may have a carrier concentration of from about $1\times10^{16} cm^{-1}$ to about $1\times10^{18} cm^{-3}$.

In still another embodiment of the present invention, a MOS gated bipolar transistor is provided which includes a plurality of the unit cells according to the present invention.

The present invention also includes methods of forming the devices described above. These methods have the further advantage of allowing for fabrication of devices according to the present invention on the same substrate as UMOSFET silicon carbide transistors. Thus, the present invention also includes methods which include the steps of forming an n-type silicon carbide drift layer on an n-type bulk single crystal silicon carbide substrate and forming a p-type silicon carbide base layer on the n-type silicon carbide drift layer. Ions are implanted through a first masking layer so as to form n-type regions of silicon carbide in the base layer to provide an emitter region and a drain region. Ions are also implanted through a second masking layer so as to form a p-type region of silicon carbide adjacent the source region. A trench is etched through a portion of the n-type source region and through the base layer and into the drift layer so as provide a gate trench. An insulating layer is formed on exposed surfaces of the base layer and the trench and a conductive contact is formed and patterned in the trench and on the base layer so as to provide a gate contact. A portion of the insulating layer is removed to expose the emitter region formed in the base layer and an emitter contact formed on the exposed emitter region. A source/collector contact is formed on a surface of the silicon carbide substrate opposite the drift layer.

In another embodiment of the methods according to the present invention, the step of implanting through a masking layer is followed by the step of annealing the resultant structure at a temperature of greater than about 1500° C. The methods may also include forming a p-type silicon carbide region in the n-type drift layer below the bottom of the trench.

In another embodiment of the methods of the present invention, a portion of the n-type source region and the p-type region of higher carrier concentration formed in the base layer are exposed and a conductive strap is formed on the exposed portions to electrically connect the n-type source region to the p-type region.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, references herein to a layer formed "on" a substrate or other layer may refer to the layer formed directly on the substrate or other layer or on an intervening layer or layers formed on the substrate or other layer. As will also be appreciated by those of skill in the art, while the present invention is described with respect to layers, such layers may be formed epitaxially or by implantation. Accordingly, the present invention is not limited to the relative size and spacing illustrated in the accompanying figures.

Figure 2:
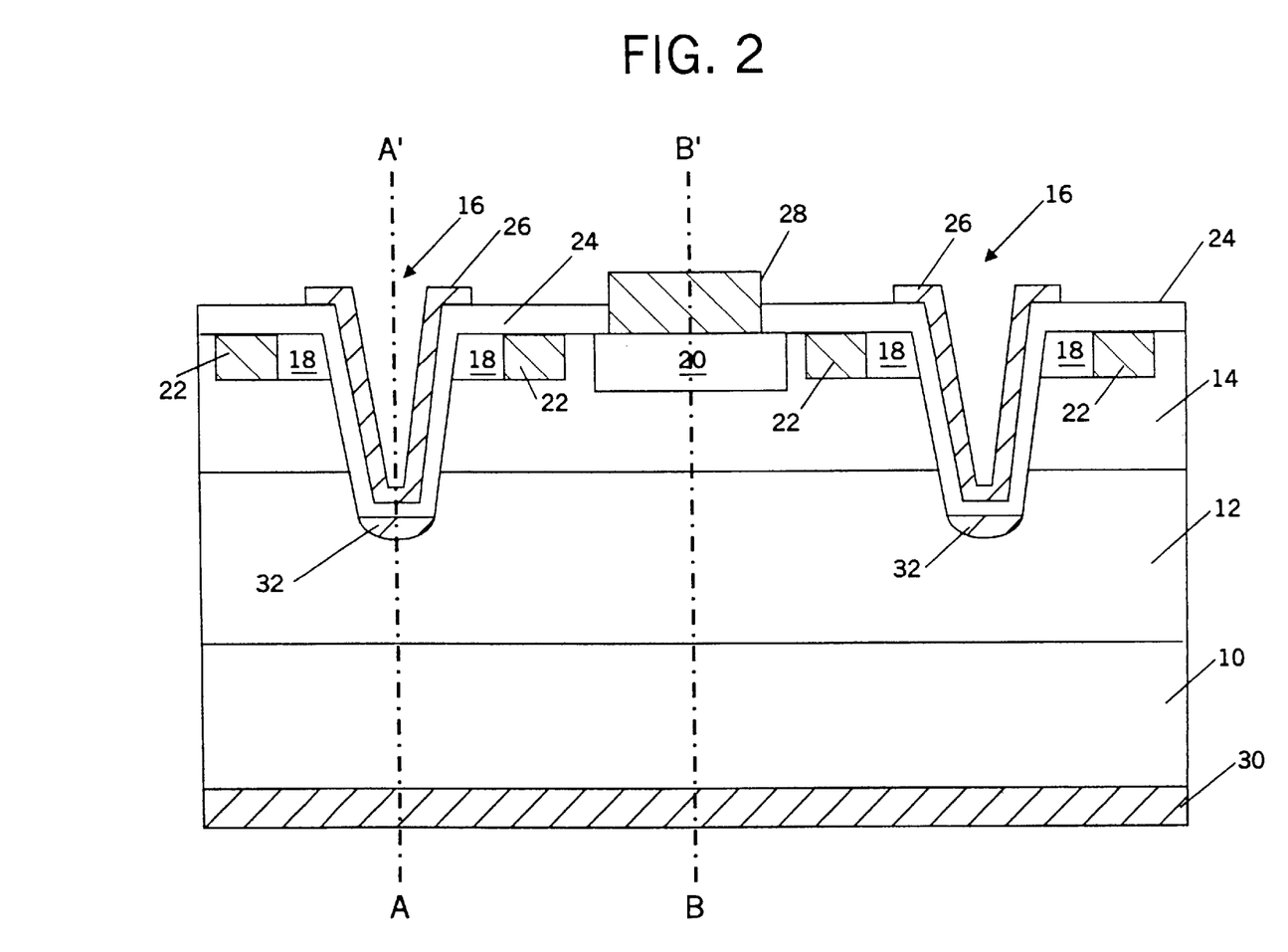
FIG. 2 is a cross sectional view of a plurality of unit cells of a power device according to the present invention.

FIG. 2 illustrates one embodiment of the present invention. As seen in FIG. 2, a combination of unit cells of a latch-up free power UMOS bipolar transistor (LMBT) are illustrated. A unit cell of of the present invention is illustrated between the lines A—A' and B—B' of FIG. 2. By mirroring this unit cell around both the A—A' line and the B—B' line devices of multiple unit cells may be produced. FIG. 2 illustrates a portion of a multiple unit cell device. As will be appreciated by those of skill in the art, the unit cell of the present invention may also be utilized to make a single unit cell device. In such a case the regions 18 and 22 need only be produced on the emitter side of the trench 16.

The LMBT of the present invention includes a bulk single crystal silicon carbide substrate 10 of n-type conductivity silicon carbide. The substrate 10 has an upper surface and a lower surface opposite the upper surface. A first layer 12 of n-type conductivity silicon carbide may be formed on the upper surface of the substrate 10 to form an n⁻ drift region. Alternatively, an n⁻ substrate could have an n⁺ region implanted in the lower surface of the substrate so as to provide n⁺ and n⁻ regions in the substrate. Thus, as used herein references to the substrate and first layer refer to layers formed both on the substrate and in the substrate. The carrier concentration of the substrate 10 is higher than the carrier concentration of the first layer 12. Thus, the substrate may be referred to as an n⁺ substrate. Sheet resistivities of less than 1 Ω-cm may be suitable for the substrate 10. Carrier concentrations of from about $10^{12}$ cm$^{-3}$ to about $10^{17}$ cm$^{-3}$ may be suitable for the first layer 12. The substrate may have a thickness of from about 100 μm to about 500 μm. The first layer 12 may have a thickness of from about 3 μm to about 500 μm.

Formed on the first layer 12 is a second layer 14 to provide a p-type base layer. The second layer 14 may be epitaxially grown and is formed of p-type conductivity silicon carbide and forms a p-type base layer for the device. Formed in the second layer 14 is region 20 of n⁺ conductivity silicon carbide which forms the emitter of the device. Also formed in the second layer 14 are n⁺ regions 18 and p⁺ regions 22. The p⁺ silicon carbide regions 22 are preferably formed adjacent n⁺ regions 18 such that a conductive p-n tunnel junction is formed between n⁺ regions 18 and p⁺ regions 22. The n⁺ regions 18 are formed such that they form a portion of the sidewall of the gate trench 16. The n⁺ regions 18 form the drain region of a MOS transistor incorporated into the present device.

The p-type base layer 14 preferably has a carrier concentration of from about $10^{16}$ cm$^{-3}$ to about $10^{18}$ cm$^{-3}$ and a thickness of from about 0.3 μm to about 5 μm. The n⁺ regions 18 preferably extend between from about 0.5 μm to about 2 μm away from the gate trench 16 and extend to a depth of from about 0.1 μm to about 2 μm. Carrier concentrations of greater than about $10^{18}$ cm$^{-3}$ maybe suitable for the n⁺ regions 18. Similarly, the p⁺ regions 22 are preferably formed to a depth of from about 0.1 μm to about 2 μm and have a width of from about 0.1 μm to about 2 μm. Carrier concentrations of greater than about $10^{16}$ cm$^{-3}$ are suitable for the p⁺ regions 22. The p-type regions 22 are also preferably separated from the emitter region 20 by from about 0.5 μm to about 4 μm. The size and shape of the emitter region may be dependent on the desired characteristics of the bipolar portion of the present device.

The device illustrated in FIG. 2 also includes a gate trench 16. The gate trench 16 is formed by forming a trench which extends downward through n⁺ regions 18 and the second layer 14 and into the first layer 12. Thus the gate trench 16 has sidewalls and a bottom. An insulator layer 24, preferably an oxide layer, is formed on the sidewalls and bottom of the gate trench and extends onto the upper surface of the n⁺ regions 18. This insulator layer 24 is preferably an oxide layer such as silicon dioxide, but may also be made of other materials such as silicon nitride, aluminum nitride or other insulator materials known to those of skill in the art. The width and depth of the gate trench 16 is dependent upon the desired electrical properties of the device. Widths of from about 1 μm to about 10 μm may be utilized for the present invention. The depth of the gate trench should be sufficiently deep such that the upper surface of the insulator/oxide layer 24 formed on the bottom of the gate trench 16 is below the interface between the second layer 14 and the first layer 12. Furthermore, the thickness of the gate insulator 24 is preferably from about 100 Å to about 1 μm, but may vary depending on the desired electrical properties of the transistor.

The device of FIG. 2 also includes an optional region of p-type conductivity silicon carbide 32 formed in the first layer 12 below the gate trench 16. This region of p-type conductivity silicon carbide 32 has a higher carrier concentration than the second layer 12. Carrier concentrations of from about $10^{16}$ cm$^{-3}$ to about $10^{19}$ cm$^{-3}$ may be utilized.

An ohmic contact is formed on the lower surface of the substrate 10 to create a collector contact 30. A contact is also formed on the sidewalls and bottom of the gate trench 16 and extends onto the upper surface of the n⁺ regions 18. This contact provides a gate contact for the device of FIG. 2. Finally, an ohmic contact 28 is formed on the n⁺ silicon carbide region 20 to provide an emitter contact for the device.

The gate trench 16 is illustrated as two trenches in FIG. 2. However, as will be appreciated by those of skill in the art, the gate trench may have many differing shapes in the third dimension (the dimension into and out of the page in FIG. 2). Thus, for example, the device illustrated in FIG. 2 may be a substantially circular device where the gate trenches 16 are a single gate trench which substantially surrounds the emitter region 20 as, for example, in a hexagonal shaped device. Also, the gate trenches 16 may be two substantially parallel trenches where the gate contacts 26 formed in the gate trenches 16 are electrically connected in the third dimension. Thus, the three dimensional configuration of the devices according to the present invention may take many differing forms while still benefiting from the teachings of the present invention.

Figure 3:
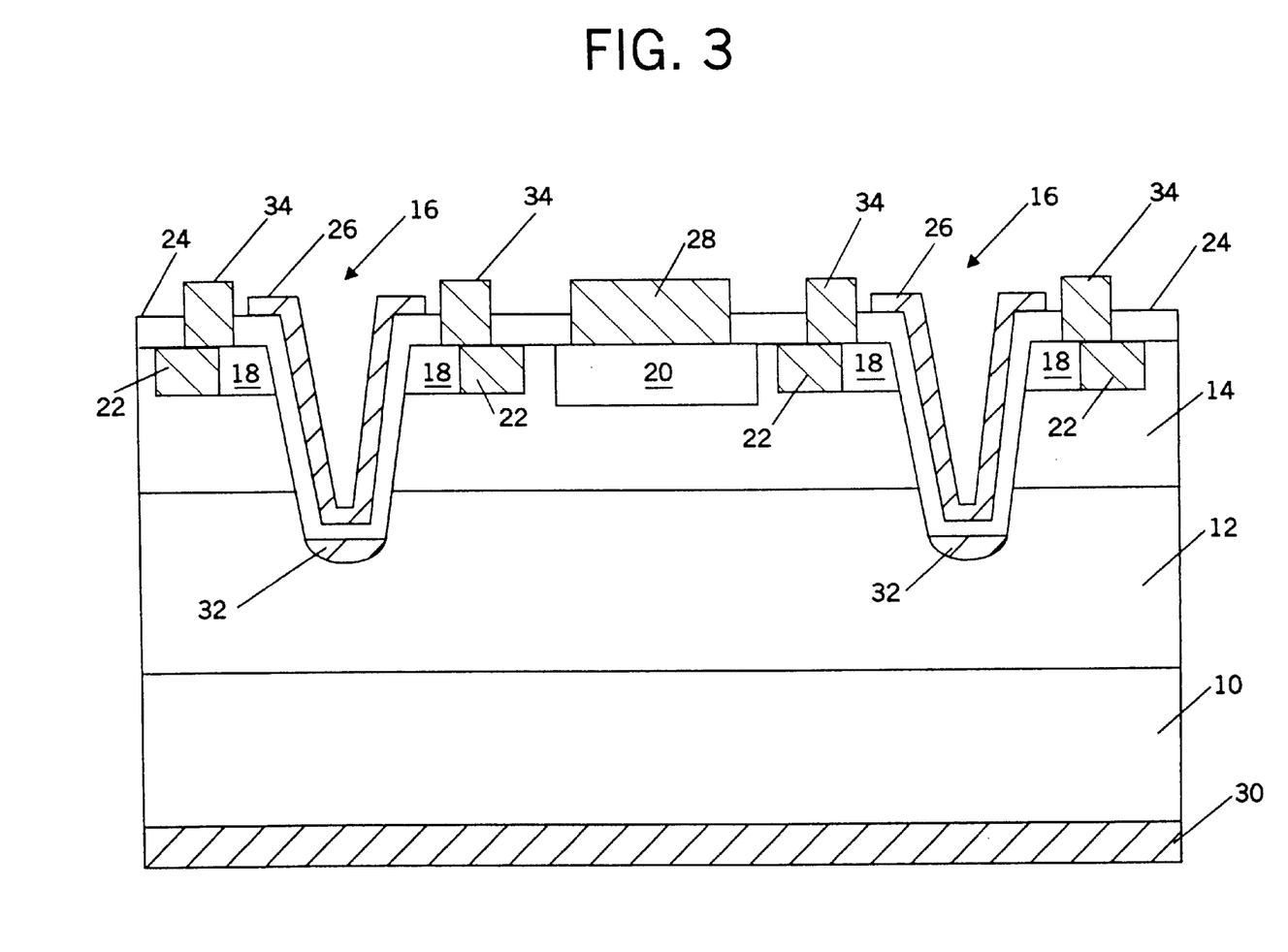
FIG. 3 is a cross sectional view of an alternative embodiment of a plurality of unit cells of a power device according to the present invention.

FIG. 3 illustrates an alternative embodiment of the present invention. As seen in FIG. 3, the structure of the device of FIG. 2 also has a conductive strap 34 connecting the n+ region 18 to the p+ region 22. In the device illustrated in FIG. 3, there should not be a rectifying p-n junction formed between n+ region 18 and p+ region 22. As will be appreciated by those of skill in the art, the unit cell illustrated in FIG. 2 is also present in FIG. 3. Thus, a device comprising any number of unit cells may be produced according to the teachings of the present invention.

As will be appreciated by those of skill in the art, the present invention may form the unit cell for a power device such that a plurality of the cells of the device may be formed and operated in parallel to increase the current carrying capabilities of the device. In such a case the unit cell of the device illustrated in FIG. 2 or FIG. 3 may be replicated in a symmetrical fashion to produce multiple devices. In such a device the outer gate trenches which are at the periphery of the device need only have the n-type and p-type regions on the emitter side of the gate trench.

Figure 4A:
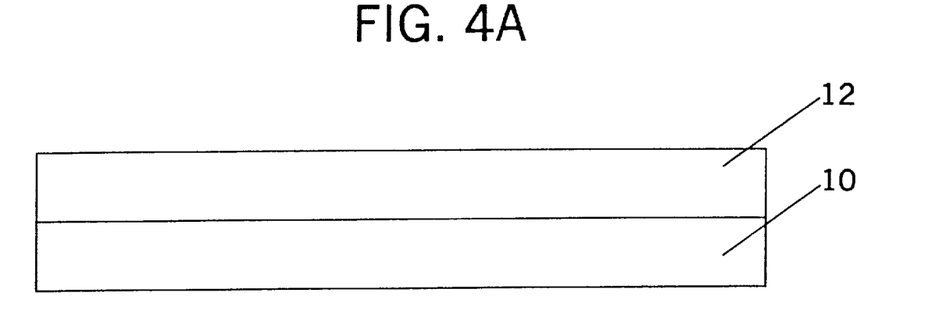
FIG. 4A through FIG. 4J are cross sectional views illustrating the fabrication of a power device according to the present invention.
Figure 4B:
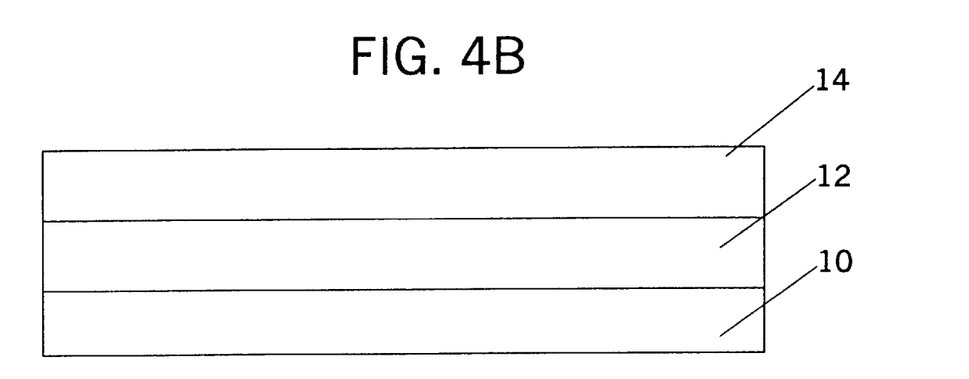
Figure 4C:
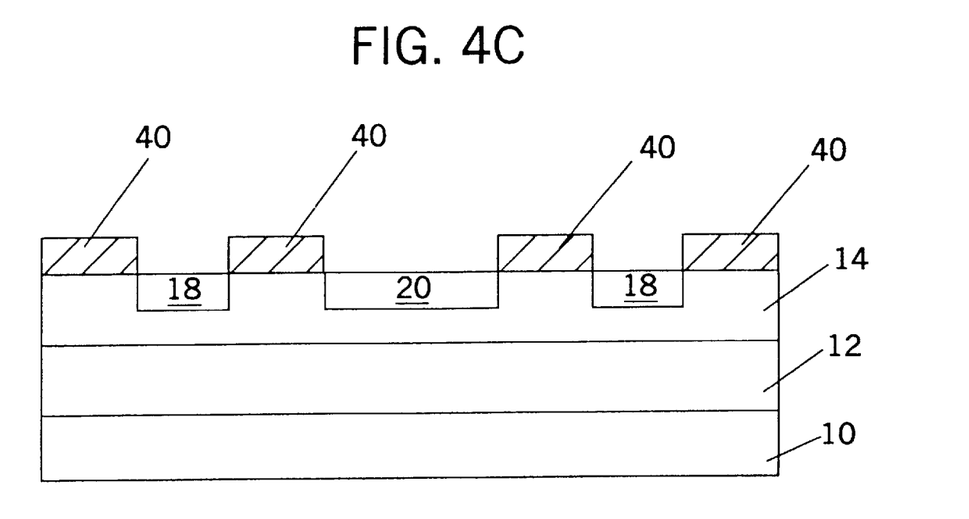

Fabrication of the devices described above with respect to FIGS. 2 and 3 will now be described with reference to FIG. 4A through FIG. 4J. In fabricating the device of FIG. 2, as illustrated in FIG. 4A, a thick n-type layer 12 is grown on the n+ substrate 10 utilizing an epitaxial growth process such as that described in the U.S. Pat. No. 4,912,064, the disclosure of which is incorporated herein by reference as if set forth fully. As discussed above, alternatively, an n− substrate may be utilized and an n+ implant performed to provide the n+ layer 10 and n− layer 12. As illustrated in FIG. 4B, a second p-type layer 14 is epitaxially grown on the first n-type epitaxially layer 12. The n+ regions 18 and 20 are then formed on the p-type layer 14. These no regions 18 and 20 may be formed by ion implantation using a mask 40 as illustrated in FIG. 4C.

Figure 4D:
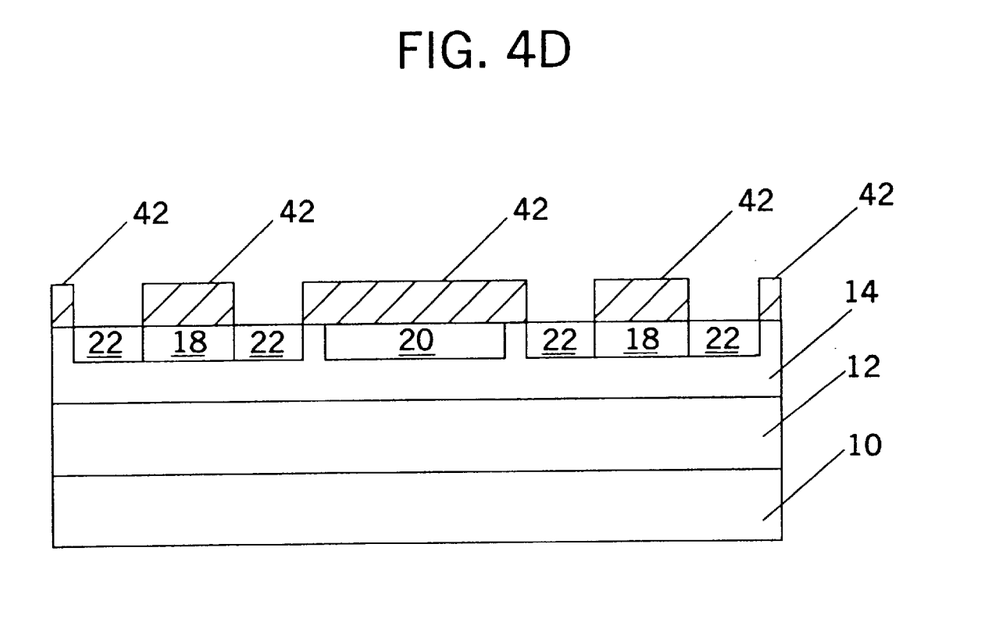

As is illustrated in FIG. 4D, the p-type regions 22 may be formed by ion implantation utilizing a mask 42. The mask 42 is preferably formed so as to position the p-type regions 22 adjacent the n-type regions 18 so as to form a conductive p-n tunnel junction between these regions. After formation of the p-type regions 22 and the n-type regions 18 and 20, the structure is annealed at a temperature greater than about 1500° C. to activate the implanted ions.

After annealing, the device may be edge terminated by etching a mesa surrounding the device. The mesa (not shown) may extend through the second layer 14 and the first layer 12 and into the substrate 10. Alternatively, the mesa may extend through the second layer 14 and into the first layer 12. In such a case, ions may be implanted in the exposed n− layer 12 to a depth of from about 100 Å to about 5 μm and to a distance of from about 5 μm to about 500 μm from the edge of the mesa. Carrier concentrations of from about $5 \times 10^{15}$ cm$^{-3}$ to about $1 \times 10^{17}$ cm$^{-3}$ may be utilized to form a low doped p-type region surrounding the mesa. In either case a passivation layer may then be formed on the exposed surfaces of the mesa (not shown). Such a passivation layer may be SiO$_2$ or other such suitable materials known to those of skill in the art.

Figure 4E:
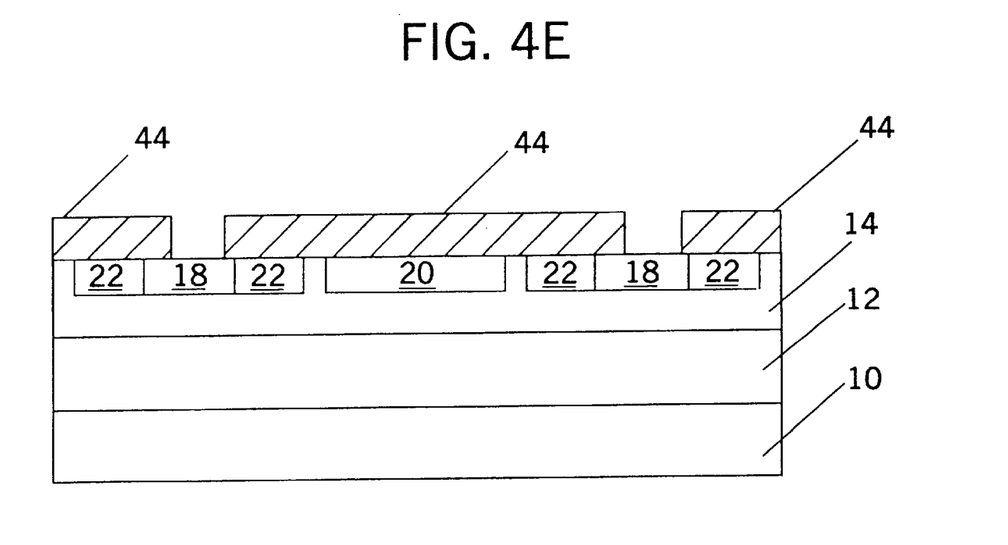

After creation of the epitaxial structure, a mask 44 is formed on the structure to position the gate trench of the device. Such a mask is illustrated in FIG. 4E. The gate trench 16 is formed by reactive ion etching through the p-type base layer 14 into the n-type drift layer 12. The gate trench 16 may be etched utilizing the reactive ion etching techniques described in U.S. Pat. No. 4,981,551, the disclosure of which is incorporated herein by reference as if set forth fully.

Figure 4F:
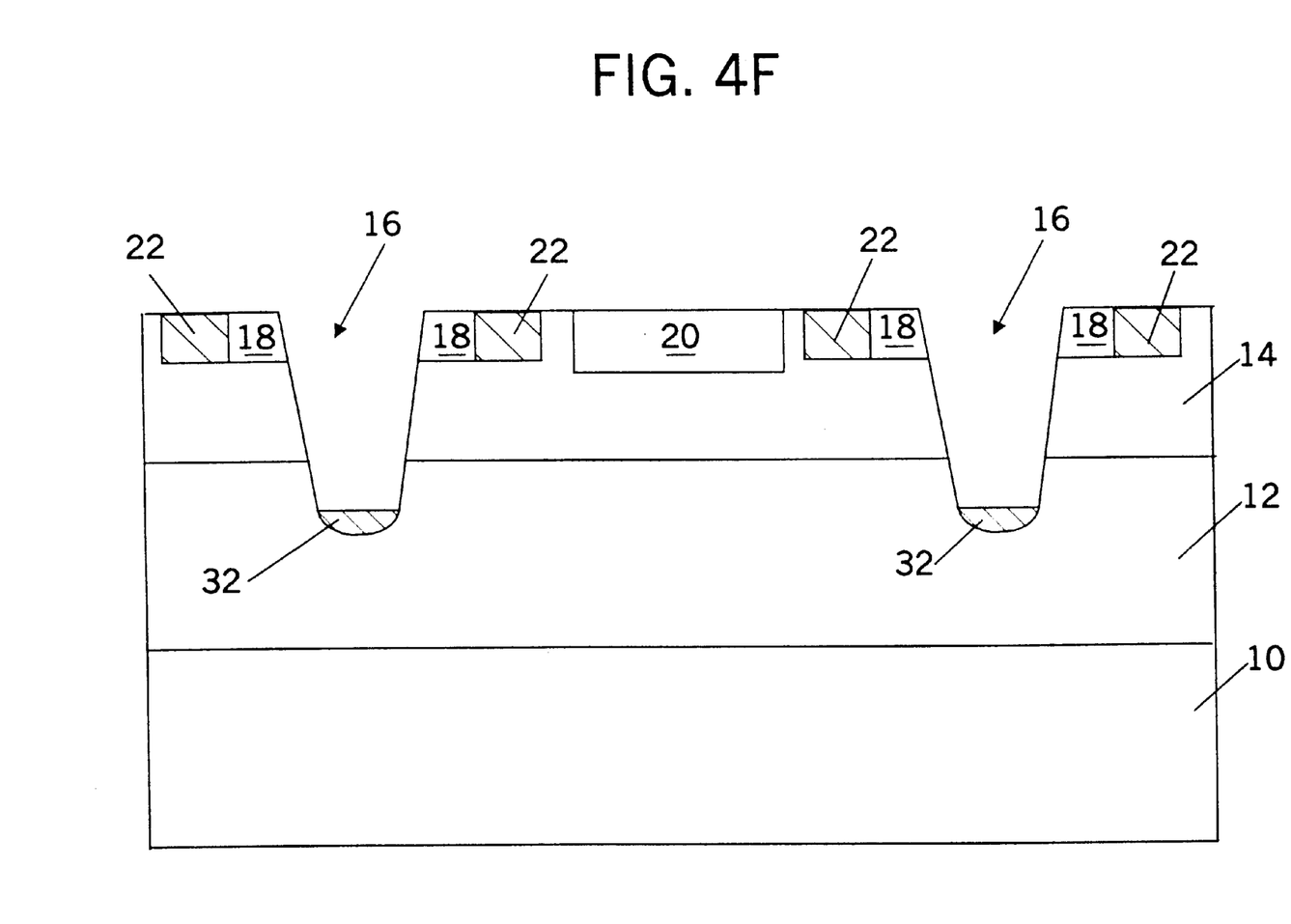

As seen in FIG. 4F, a p-type region 32 may optionally be ion implanted at the bottom of the gate trench 16. This p-type region 32 at the bottom of the trench 16 may reduce field crowding at the corner of the gate trench and, thereby, increase breakdown voltage of the MOS portion of the device. This p+ implanted region 32 may be formed by a method such as those described in U.S. Pat. No. 5,087,576, the disclosure of which is incorporated herein by reference as if set forth fully.

Figure 4G:
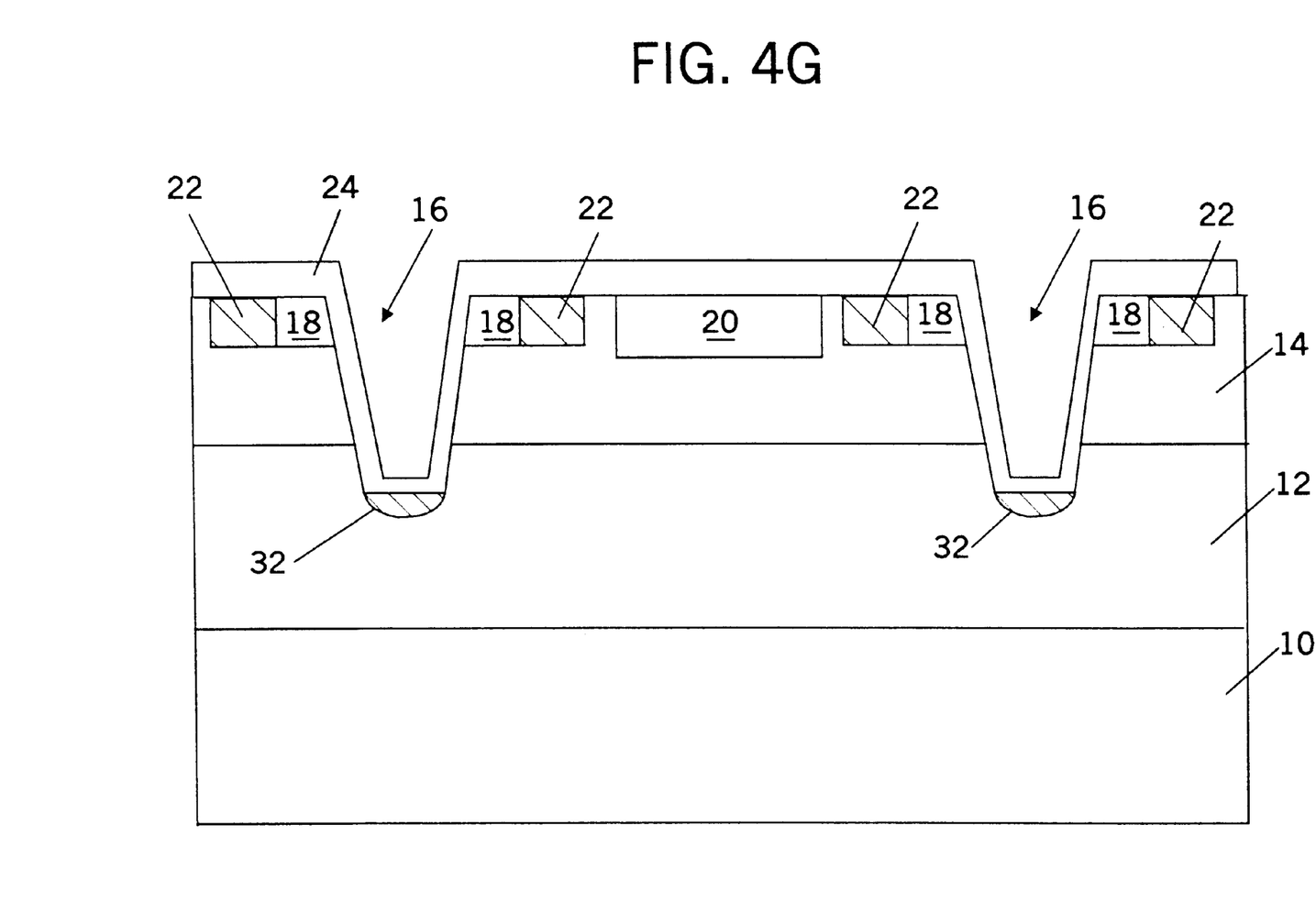

After formation of the gate trench 16, an insulator/oxide layer 26 is formed on the epitaxial structure as illustrated in FIG. 4G. The insulator layer 24 is formed so as to cover the bottom and sidewalls of the trench 16 and extend onto the upper surface of the n+ regions 18. The insulator/oxide layer 24 preferably utilizes either a thermal oxidation process such as that described in commonly assigned U.S. patent application Ser. No. 08/554,319 entitled "Process For Reducing Defects In Oxide Layers In Silicon Carbide", the disclosure of which is incorporated herein by reference as if set forth fully, or a deposited oxide process such as that described in U.S. Pat. No. 5,459,107 and U.S. patent application Ser. No. 08/554,319, the disclosures of which are incorporated herein by reference as if set forth fully. If the thermal oxidation process is used then the preferred embodiment is to use carbon faced wafers such as described in U.S. Pat. No. 5,506,421, the disclosure of which is incorporated herein by reference as if set forth fully.

Figure 4H:
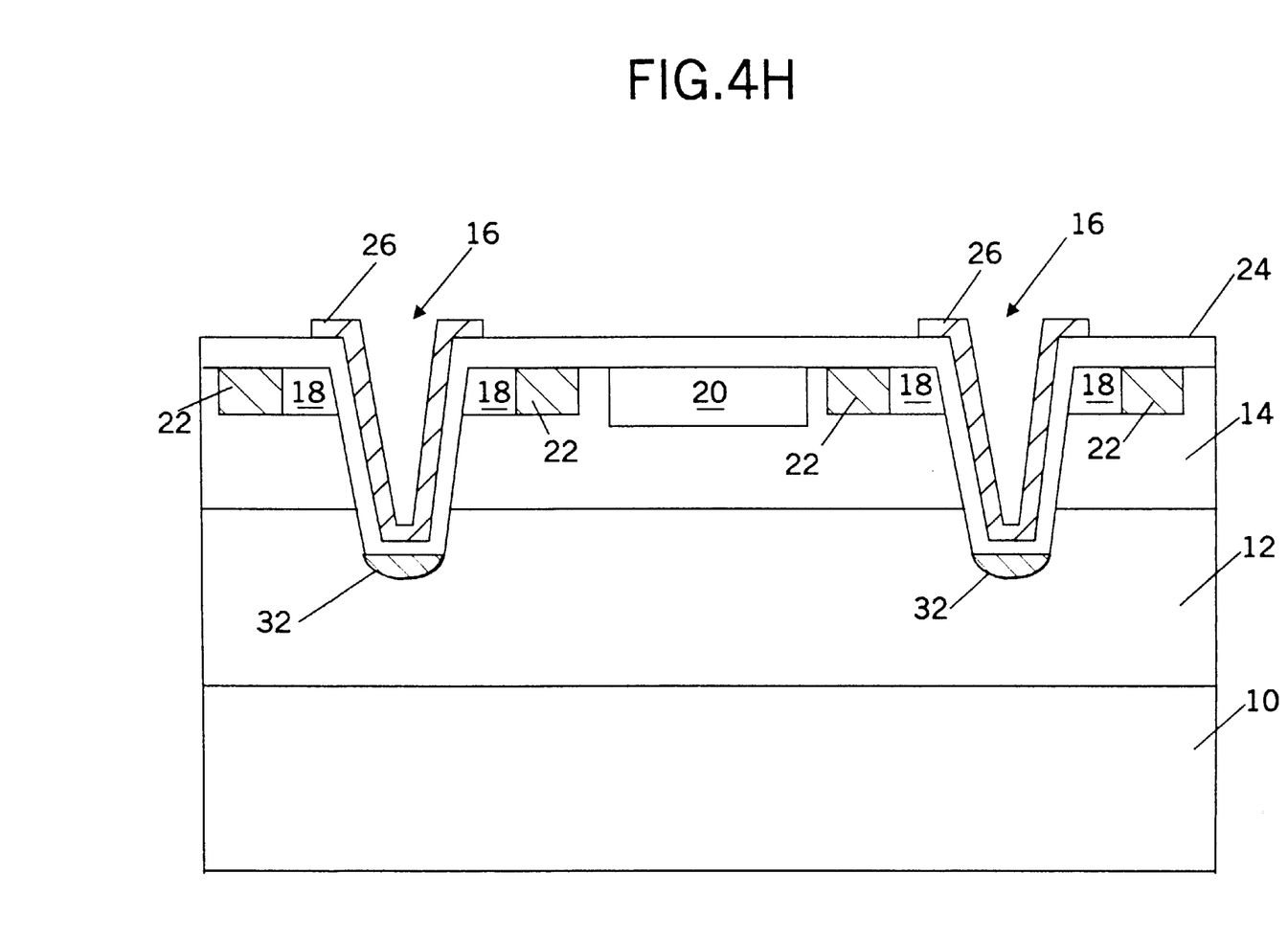
Figure 4I:
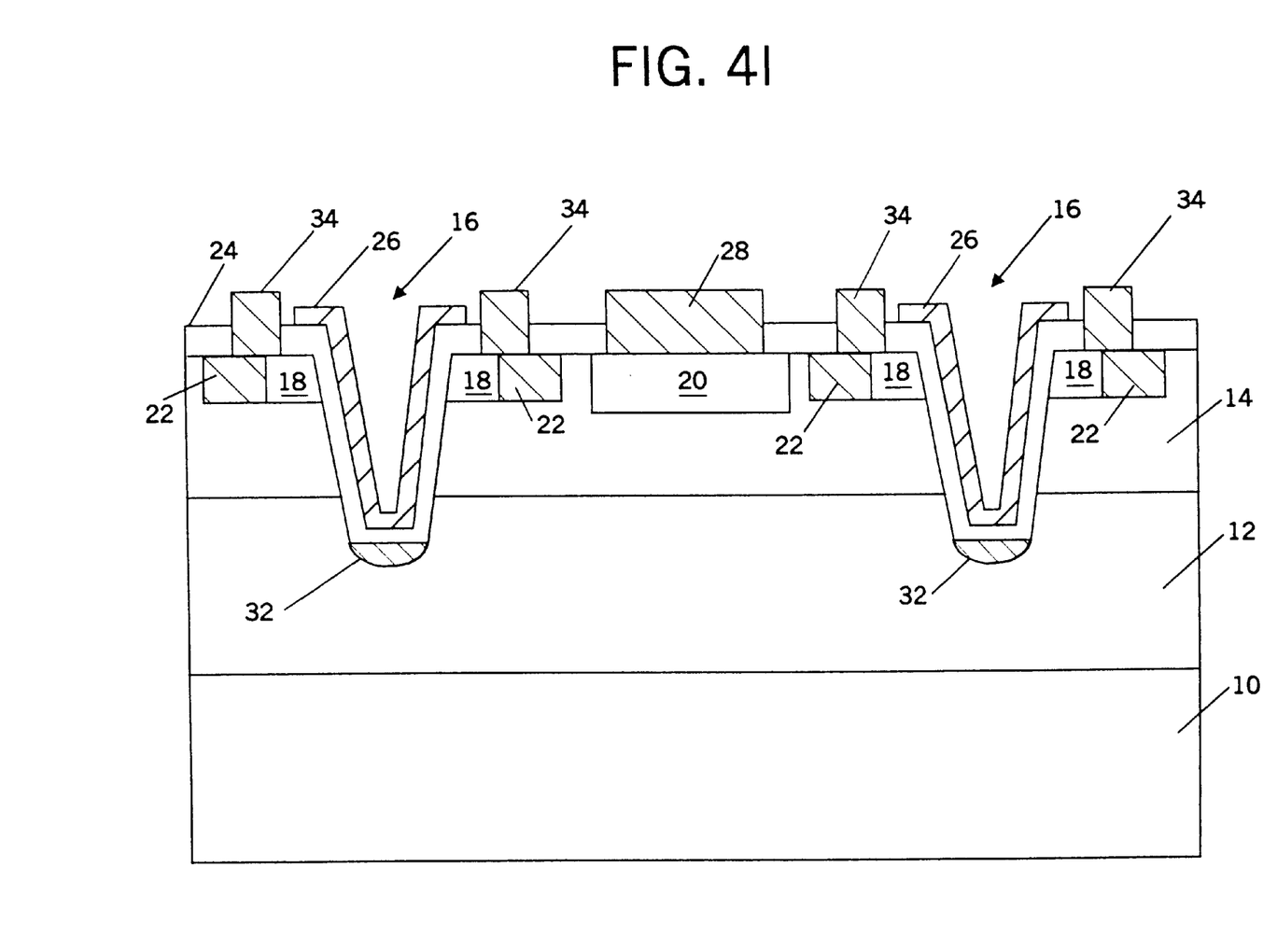
Figure 4J:
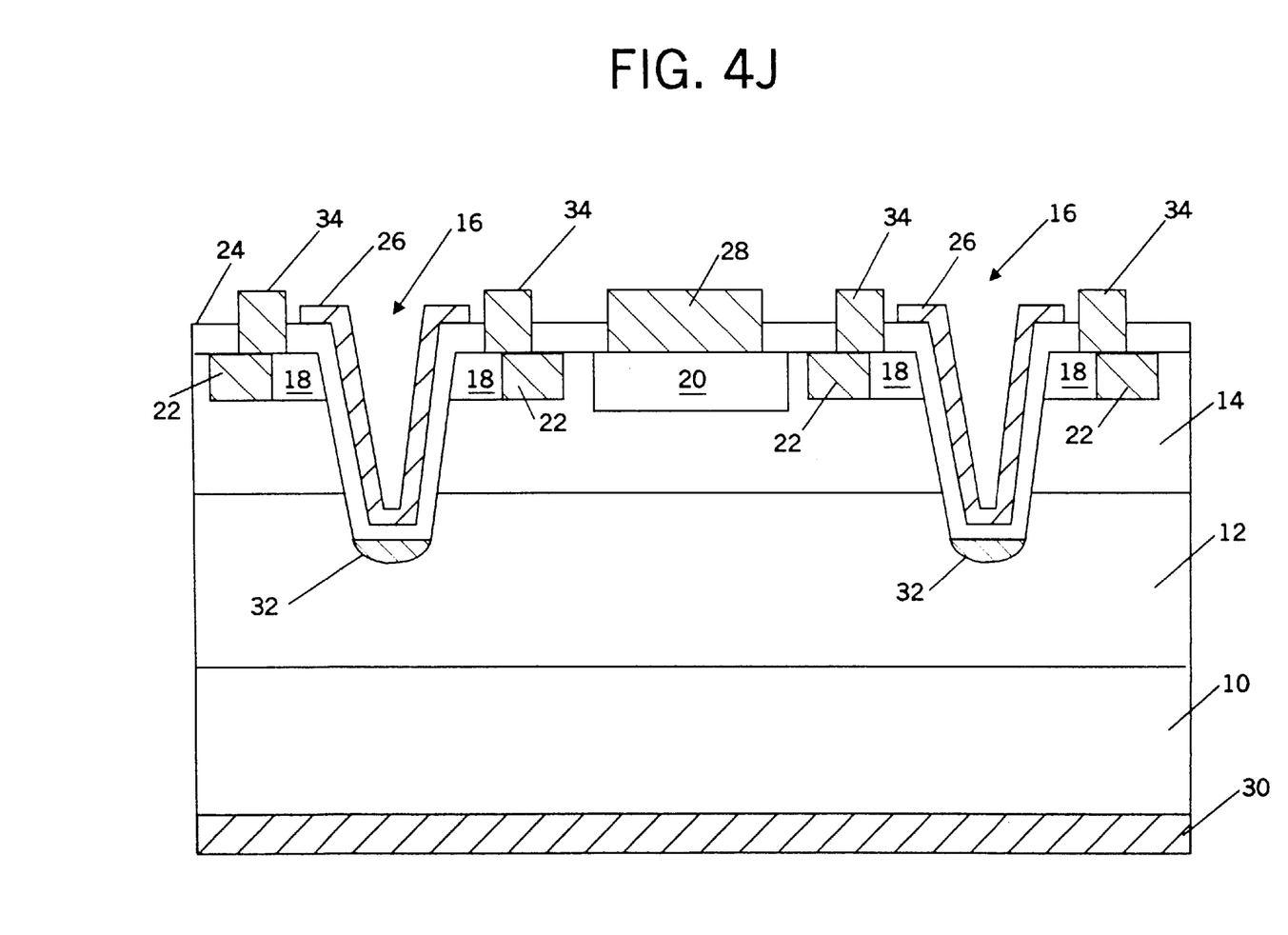

The formation of contacts for the present device is illustrated in FIGS. 4H through 4J. The gate contact may be formed by depositing a conducting layer in the gate trench 16 as illustrated in FIG. 4H. As illustrated in FIG. 4H the gate material 26, preferably molybdenum, may be deposited on the insulating layer 24 and patterned so as to extend above a portion of the n-type region 18. As seen in FIG. 4I, the emitter contact 28 and the optional conductive strap 34 may be formed simultaneously by forming openings in the insulating layer 24 and then depositing nickel or other suitable contact materials on the exposed portion of layer 14. Finally, as illustrated in FIG. 4J, a collector contact 30 is formed on the exposed side of the substrate by deposition of nickel or other suitable contact material.

In each of the embodiments described above, the substrate and layers may be formed of silicon carbide selected from the group of 6H, 4H, 15R, or 3C silicon carbide, however, 4H silicon carbide is preferred for each of the devices described above. The preferred metals for ohmic contacts include nickel, tantalum silicide and platinum. Additionally, aluminum/titanium contacts may also be used to form the ohmic contacts of the present invention. While these particular metals have been described, any other metals known to those of skill in the art which form ohmic contacts with silicon carbide may be used.

With regard to the carrier concentrations or doping levels of the epitaxial layers and implanted regions of the devices described above, the p+ or n+ conductivity type regions and epitaxial layers should be as heavily doped as possible without causing excessive fabrication defects. Suitable dopants for producing the p-type regions include aluminum, boron or gallium. Suitable dopants for producing the n-type regions include nitrogen and phosphorus. Aluminum is the preferred dopant for the p+ regions and it is preferred that the aluminum be implanted in the p+ regions using high temperature ion implantation such as is described above and employing temperatures of between 1000° C. and 1500° C. Carrier concentrations of up to about $3 \times 10^{17}$ cm$^{-3}$ are suitable for the n epitaxial layers, however, carrier concentrations of about $3 \times 10^{16}$ cm$^{-3}$ or less are preferred.

As will be appreciated by those of skill in the art, the thickness of epitaxial layers 12 and 14 will be dependent upon the desired operating characteristics of the device. Furthermore, these operating characteristics will be affected by the number of unit cells employed and the geometry of the unit cells in a multiple cell device. The width of the gate trench will also be dependent upon the desired operating characteristics of the device, the number of unit cells employed to achieve those operating characteristics, and the geometry utilized for the unit cell itself.

In operation, the device of the present invention provides a silicon carbide device which combines bipolar conduction with MOS gated control. Furthermore, the present invention utilizes an n-type silicon carbide substrate which allows for referencing the gate voltage to the emitter of the device. This relationship allows for referencing the gate voltage to ground in a power circuit. Another advantage of the present invention is that n channel conduction through the MOS transistor is utilized for base current injection which reduces the impact of lower electron channel mobility in silicon carbide.

Turn on of devices according to the present invention is accomplished by the application of a positive bias on the collector 30 (about 3–10 V) and a positive bias on the gate 26 (about 15–40 V) while the emitter 28 is kept at ground potential. The source of the NMOSFET 18 is floating during the off state and is at approximately 3 V (the silicon carbide forward bias voltage drop for a p-n junction) above the emitter voltage in operation. A positive bias on the gate 26 enables the turn-on of the nMOSFET. The gate voltage ($V_g$) for turn-on of the device will then be 15 $V+V_t+3$ V, where $V_t$ is the threshold voltage for the MOS device. Positively biasing the gate with respect to the source allows a path for the flow of electrons from the collector to the base of the npn transistor thereby forward biasing its emitter-base junction. The device achieves a high current density operation by the injection of minority carriers into the low doped drift region by the turn-on of the npn transistor. Hence, this device achieves a high current density with relatively low forward voltage drop. The base current to the npn transistor is limited by the saturation current of the MOS transistor which in turn results in current saturation characteristics of the LMBT. Higher gate voltage allows for higher base current into the npn transistor and hence a higher saturation current of the LMBT.

The device enters the forward blocking mode of operation when the gate potential is made the same as the emitter potential. This turns off the NMOSFET which reduces the base current of the npn transistor to zero. After the minority carriers of the npn transistor decay with their characteristic lifetime, the device stops carrying current and can support substantial collector voltage. This voltage is supported by the p-base 14 to n drift region 12 junction and the p$^+$ buffer/gate oxide-n$^-$ drift region junction. The p$^+$ buffer region 32 may optionally be shorted to the p-base in the third dimension. The purpose of this buffer is to prevent high electric fields in the gate dielectric in the forward blocking mode of operation of the device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A MOS bipolar transistor comprising:
   a silicon carbide npn bipolar transistor on a bulk single crystal n-type silicon carbide substrate and having an n-type drift layer and a p-type base layer;
   a silicon carbide nMOSFET in said p-type base layer including spaced apart n-type source and drain regions with a gate region therebetween and adjacent said npn bipolar transistor so as to provide base current to said npn bipolar transistor when said bipolar transistor is in a conductive state; and
   means for converting electron current flowing between said source and said drain into hole current for injection into said p-type base layer.

2. A MOS bipolar transistor according to claim 1, wherein said means for converting comprises a silicon carbide tunnel diode in said p-type base layer between said nMOSFET and said npn bipolar transistor so as to convert electron current flowing through said nMOSFET to hole current for injection into said base layer of said npn bipolar transistor.

3. A MOS bipolar transistor according to claim 2, wherein said tunnel diode includes a region of p-type conductivity silicon carbide having a higher carrier concentration than said p-type base layer adjacent said n-type conductivity source region so as to provide a conductive p-n tunnel junction between said source region and said p-type conductivity region.

4. A MOS bipolar transistor according to claim 1 wherein said means for converting comprises:
   a region of p-type conductivity silicon carbide in said p-type base layer and having a higher carrier concentration than said p-type base layer; and
   an electrically conductive strap for electrically connecting the n-type source region of said nMOSFET to said region of p-type conductivity silicon carbide.

5. A MOS bipolar transistor according to claim 1, wherein said silicon carbide nMOSFET comprises a UMOSFET having a gate trench adjacent said npn bipolar transistor and having a source region so as to provide electrons to said means for converting and wherein said npn bipolar transistor comprises a vertical npn bipolar transistor.

6. A MOS bipolar transistor according to claim 1, wherein said MOS bipolar transistor includes a plurality of unit cells so as to provide a plurality of electrically parallel npn bipolar transistors.

7. A MOS bipolar transistor according to claim 1, wherein said MOS bipolar transistor is formed on a 4H n-type conductivity bulk single crystal silicon carbide substrate.

8. A unit cell of a UMOS bipolar transistor comprising:
   an n-type bulk single crystal silicon carbide substrate;
   an n-type silicon carbide drift layer adjacent said n-type conductivity bulk single crystal silicon carbide substrate, said n-type drift layer having a carrier concentration of less than said n-type silicon carbide substrate;
   a p-type silicon carbide base layer on said n-type silicon carbide drift layer;
   a first n-type region of silicon carbide in said p-type base layer;
   a gate trench in said p-type base layer and extending through said base layer and said first n-type region to said drift layer so as to provide a portion of said n-type region as a portion of the sidewall of said gate trench;
   an insulating layer on the bottom and sidewalls of said gate trench;
   a second n-type conductivity region of silicon carbide in said base layer adjacent and disposed from said gate trench;
   a gate contact on said insulating layer and extending over a portion of said first n-type region;

a collector contact on a surface of said silicon carbide substrate opposite said drift layer;

a p-type region of silicon carbide in said base layer and disposed between said first n-type region and said second n-type region, said p-type region having a carrier concentration greater than the carrier concentration of said p-type base layer and formed so as to convert electrons flowing through said first n-type region into holes for injection into said p-type base layer; and an emitter contact on said second n-type region of silicon carbide.

9. The unit cell according to claim 8, further comprising:

a p-type region of silicon carbide in said n-type silicon carbide drift region at the bottom of said gate trench and having a carrier concentration greater than the carrier concentration of said p-type base layer.

10. The unit cell according to claim 8, wherein said p-type region forms a p-n junction with said first n-type region so as to provide a tunnel diode.

11. The unit cell according to claim 8, further comprising:

a conductive strap between said first n-type region and said p-type region so as to provide electrical connection between said p-type region to said first n-type region.

12. The unit cell according to claim 8, wherein said p-type base layer has a thickness of from about 0.3 $\mu$m to about 5 $\mu$m.

13. The unit cell according to claim 8, wherein said n-type drift region has a thickness of from about 3 $\mu$m to about 500 $\mu$m.

14. The unit cell according to claim 8, wherein said n-type drift region has a carrier concentration of from about $10^{12}$ to about $10^{17}$ cm$^{-3}$.

15. The unit cell according to claim 8, wherein said p-type base layer has a carrier concentration of from about $10^{16}$ to about $10^{18}$ cm$^{-3}$.

16. A MOS gated bipolar transistor comprising a plurality of the unit cells of claim 8.

17. A unit cell according to claim 8 wherein said insulating layer comprises an oxide layer.

18. A method of forming a UMOS bipolar transistor comprising:

forming an n-type silicon carbide drift layer on an n-type conductivity bulk single crystal silicon carbide substrate, said n-type drift layer having a carrier concentration of less than said n-type silicon carbide substrate;

forming a p-type silicon carbide base layer on said n-type silicon carbide drift layer;

forming a first n-type region of silicon carbide in said p-type base layer;

forming a first gate trench formed in said p-type base layer and extending through said base layer and said first n-type region to said drift layer so as to provide a portion of said n-type region as a portion of the sidewall of said gate trench;

forming an insulating layer formed on the bottom and sidewalls of said gate trench;

forming a second n-type conductivity region of silicon carbide formed in said base layer adjacent and disposed from said gate trench;

forming a gate contact formed on said insulating layer and extending over a portion of said first n-type region;

forming a collector contact formed on a surface of said silicon carbide substrate opposite said drift layer;

forming a p-type region of silicon carbide formed in said base layer and disposed between said first n-type region and said second n-type region, said p-type region having a carrier concentration greater than the carrier concentration of said p-type base layer and formed so as to convert electrons flowing through said first n-type region into holes for injection into said p-type base layer; and forming an emitter contact formed on said second n-type region of silicon carbide.

19. The method according to claim 18, further comprising the step of:

forming a p-type region of silicon carbide formed in said n-type silicon carbide drift region at the bottom of said gate trench and having a carrier concentration greater than the carrier concentration of said p-type base layer.

20. The method according to claim 18, wherein said step of forming a p-type region includes the step of forming a p-type region which forms a p-n junction with said first n-type region so as to provide a tunnel diode.

21. The method according to claim 18, further comprising the step of:

forming a conductive strap between said first n-type region and said p-type region so as to provide electrical connection between said p-type region to said first n-type region.

22. A method according to claim 18, further comprising the step of forming a plurality of the unit cells of claim 18 so as to provide a plurality of electrically parallel MOS gated bipolar transistor.

23. A method according to claim 18, wherein said step of forming an n-type silicon carbide drift layer on an n-type conductivity bulk single crystal silicon carbide substrate comprises the step of implanting ions in a silicon carbide substrate so as to provide a region of higher carrier concentration in the substrate and a drift layer in the substrate.

24. A method of forming a MOS gated bipolar transistor comprising the steps of:

forming an n-type silicon carbide drift layer on an n-type bulk single crystal silicon carbide substrate;

forming a p-type silicon carbide base layer on the n-type silicon carbide drift layer;

implanting through a first mask ions so as to form a n-type regions of silicon carbide in the base layer to provide an emitter region and a drain region;

implanting through a second mask ions so as to form a p-type region of silicon carbide adjacent the source region;

etching a trench through a portion of the n-type source region and through the base layer and into the drift layer so as provide a gate trench;

forming an insulating layer on exposed surfaces of the base layer and the trench;

forming and patterning an ohmic contact in the trench and on the base layer so as to provide a gate contact;

removing a portion of the insulating layer to expose the emitter region formed in the base layer;

forming an emitter contact on the exposed emitter region; and forming a source/emitter contact on a surface of the silicon carbide substrate opposite the drift layer.

25. A method according to claim 24, wherein said step of implanting through a masking layer is followed by the step of annealing the resultant structure at a temperature of greater than about 1500° C.

26. A method according to claim 24, further comprising the step of forming a p-type silicon carbide region in the n-type drift layer below the bottom of the trench.

27. A method according to claim 24, further comprising the steps of:

exposing a portion of the n-type source region and the p-type region of higher carrier concentration formed in the base layer;

forming on the exposed portion of the n-type source region and p-type region a conductive strap to electrically connect the n-type source region to the p-type region.

28. A method according to claim 24, wherein said step of implanting ions to form n-type source and emitter regions comprises the step of implanting ions selected from the group consisting of nitrogen and phosphorus.

29. A method according to claim 24, wherein said step of implanting ions to form a p-type region of higher carrier concentration comprises implanting ions selected from the group consisting of aluminum, boron or gallium.

30. A method according to claim 24, wherein said step of forming an n-type silicon carbide drift layer on an n-type bulk single crystal silicon carbide substrate comprises the steps of:

forming an n-type silicon carbide substrate; and implanting ions in the silicon carbide substrate so as to provide a region of higher carrier concentration in the substrate and a drift layer in the substrate.

* * * * *